(12) United States Patent
Kobel

(10) Patent No.: US 11,466,809 B2
(45) Date of Patent: Oct. 11, 2022

(54) GANTRY-TYPE POSITIONING DEVICE

(71) Applicant: ETEL S.A., Motiers (CH)

(72) Inventor: Philipp Kobel, Nidau (CH)

(73) Assignee: ETEL S.A., Motiers (CH)

( * ) Notice: Subject to any disclaimer, the term of this patent is extended or adjusted under 35 U.S.C. 154(b) by 390 days.

(21) Appl. No.: 16/720,013

(22) Filed: Dec. 19, 2019

(65) Prior Publication Data

US 2020/0200324 A1 Jun. 25, 2020

(30) Foreign Application Priority Data

Dec. 20, 2018 (EP) ..................................... 18214545

(51) Int. Cl.
| | |
|---|---|
| *F16M 11/20* | (2006.01) |
| *F16C 32/06* | (2006.01) |
| *F16M 11/22* | (2006.01) |
| *H01L 21/68* | (2006.01) |

(52) U.S. Cl.
CPC ..... *F16M 11/2085* (2013.01); *F16C 32/0603* (2013.01); *F16M 11/2014* (2013.01); *F16M 11/2092* (2013.01); *F16M 11/22* (2013.01); *H01L 21/68* (2013.01); *F16M 2200/08* (2013.01)

(58) Field of Classification Search
CPC ........... F16M 11/2085; F16M 11/2014; F16M 11/2092; F16M 11/22; F16M 32/0603; F16M 2200/08; H01L 21/68
USPC ..................................................... 74/490.08
See application file for complete search history.

(56) References Cited

U.S. PATENT DOCUMENTS

| | | | |
|---|---|---|---|
| 4,098,001 A | 7/1978 | Watson | |
| 5,874,820 A | 2/1999 | Lee | |
| 6,077,078 A * | 6/2000 | Alet | F16M 11/18 |
| | | | 472/130 |
| 6,134,981 A * | 10/2000 | Novak | G03F 7/70358 |
| | | | 74/490.09 |
| 6,798,088 B2 | 9/2004 | Hsu et al. | |
| 7,707,907 B2 * | 5/2010 | Bonev | B25J 9/106 |
| | | | 74/490.03 |

(Continued)

FOREIGN PATENT DOCUMENTS

| | | |
|---|---|---|
| CN | 102762339 A | 10/2012 |
| CN | 105108502 A | 12/2015 |

(Continued)

*Primary Examiner* — Nkeisha Smith
(74) *Attorney, Agent, or Firm* — Leydig, Voit & Mayer Ltd.

(57) ABSTRACT

A gantry-type positioning device includes a planar base parallel to first and second directions. Two first linear axes are arranged in the first direction, each having a first linear drive. A frame held by the first linear axes is movable in the first direction, and comprises two transverse and two longitudinal beams. The transverse beams carry second linear axes with second linear drives parallel to the second direction, so that a movable element arranged between the transverse beams is movably held by the second linear actuators. The frame is flexibly constructed such that the movable element is rotatable about a third direction which is perpendicular to the first and second directions. With respect to the third direction, the movable element is guidable by a guide surface of only one of the transverse beams serving as a guide beam for the movable element.

20 Claims, 3 Drawing Sheets

(56) References Cited

U.S. PATENT DOCUMENTS

| | | | |
|---|---|---|---|
| 8,040,099 | B2 | 10/2011 | Coleman et al. |
| 8,109,395 | B2 | 2/2012 | Gaunekar et al. |
| 8,267,582 | B2 * | 9/2012 | Schubert ................ B82Y 10/00 384/12 |
| 9,434,023 | B2 * | 9/2016 | Sawabe ................ B23K 26/042 |
| 10,502,359 | B2 * | 12/2019 | Xie ........................ F16M 11/22 |
| 10,580,677 | B2 * | 3/2020 | Vix ................... H01L 21/68757 |
| 2001/0050341 | A1 | 12/2001 | Kwan et al. |
| 2007/0216892 | A1 | 9/2007 | Eidelberg |
| 2017/0087663 | A1 * | 3/2017 | Onoe ..................... B23K 26/50 |
| 2019/0063669 | A1 * | 2/2019 | Ingram ................. G05B 19/27 |

FOREIGN PATENT DOCUMENTS

| | | |
|---|---|---|
| CN | 107378514 A | 11/2017 |
| DE | 102009008900 A1 | 11/2009 |
| EP | 1810776 A1 | 7/2007 |
| EP | 2066996 B1 | 8/2012 |
| JP | 2012118601 A | 6/2012 |

* cited by examiner

GANTRY-TYPE POSITIONING DEVICE

CROSS-REFERENCE TO PRIOR APPLICATION

Priority is claimed to European Patent Application No. EP 18 214 545.8, filed on Dec. 20, 2018, the entire disclosure of which is hereby incorporated by reference herein.

FIELD

The present invention relates to a gantry-type positioning device. Such positioning devices are used, for example, in semiconductor manufacture for the precise positioning of a movable element such as a wafer stage in a plane.

BACKGROUND

A positioning device with a gantry-type design is known from U.S. Pat. No. 6,798,088 B2. Two parallel guides with linear drives hold a rigid frame with two transverse beams so that it is movable in a first direction. A movable element is held between these transverse beams so that it is movable in a second direction. The movable element can thus be positioned in two directions. Since the frame is rigid, the movable element cannot be rotated about a third direction—a requirement that exists in the field of semiconductor fabrication in order, for example, to compensate for a slight skewing of a wafer deposited on a stage.

EP 2066996 B1 therefore discloses a positioning device of a gantry-type design in which a single transverse beam is connected to two parallel linear axes in such a flexible manner that it can be rotated by corresponding actuation of the linear axes by minor amounts (a few degrees) about a direction which is perpendicular to the actual working plane of the positioning device. The movable element can thus be positioned in all three degrees of freedom within a plane (translation in two directions within a plane, rotation about a third direction perpendicular to the plane—also called in-plane degrees of freedom). The document discloses various methods of detecting the position of the movable element in order to be able to position it particularly accurately.

A combination of the two aforementioned documents is disclosed in U.S. Pat. No. 5,874,820. Here, a movable frame in a positioning device is disclosed which, as before, is held movably between two parallel linear axes. The corners of this frame are flexibly coupled to one another by flexure joints, so that the frame can be skewed within certain limits. A movable element is guided between the two transverse beams of the frame. The frame and the movable element are guided by means of air bearings on a base of the positioning device, the movable element being guided in addition by lateral air bearings along the two transverse beams of the frame. However, such a frame is complicated and expensive to produce since the frame must be manufactured from very high-quality materials and must be manufactured with a plurality of precisely machined guide surfaces for the lateral air bearings.

In addition, U.S. Pat. No. 4,098,001 discloses a special flexure joint having a virtual pivot point.

SUMMARY

In an embodiment, the present invention provides a positioning device of a gantry-type design which includes a planar base parallel to a first direction and to a second direction. Two first linear axes are arranged in the first direction, each of the first linear axes having a first linear drive. A frame is held by the first linear axes. The frame is movable in the first direction, and comprises two transverse beams running in the second direction and two longitudinal beams running in the first direction that are attached to the transverse beams. One of the longitudinal beams is in each case connected to one of the first linear drives. The transverse beams carry second linear axes in each case with a second linear drive parallel to the second direction, so that a movable element arranged between the transverse beams is movably held by the second linear actuators in the second direction. The movable element is thereby movable in the first and second directions. Additionally, the frame is flexibly constructed such that the movable element is rotatable about a third direction which is perpendicular to the first and second directions. The movable element is guidable by the planar base with respect to the third direction and rotations about the first and second directions. With respect to the third direction, the movable element is guidable by a guide surface of only one of the transverse beams which thereby serves as a guide beam for the movable element.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
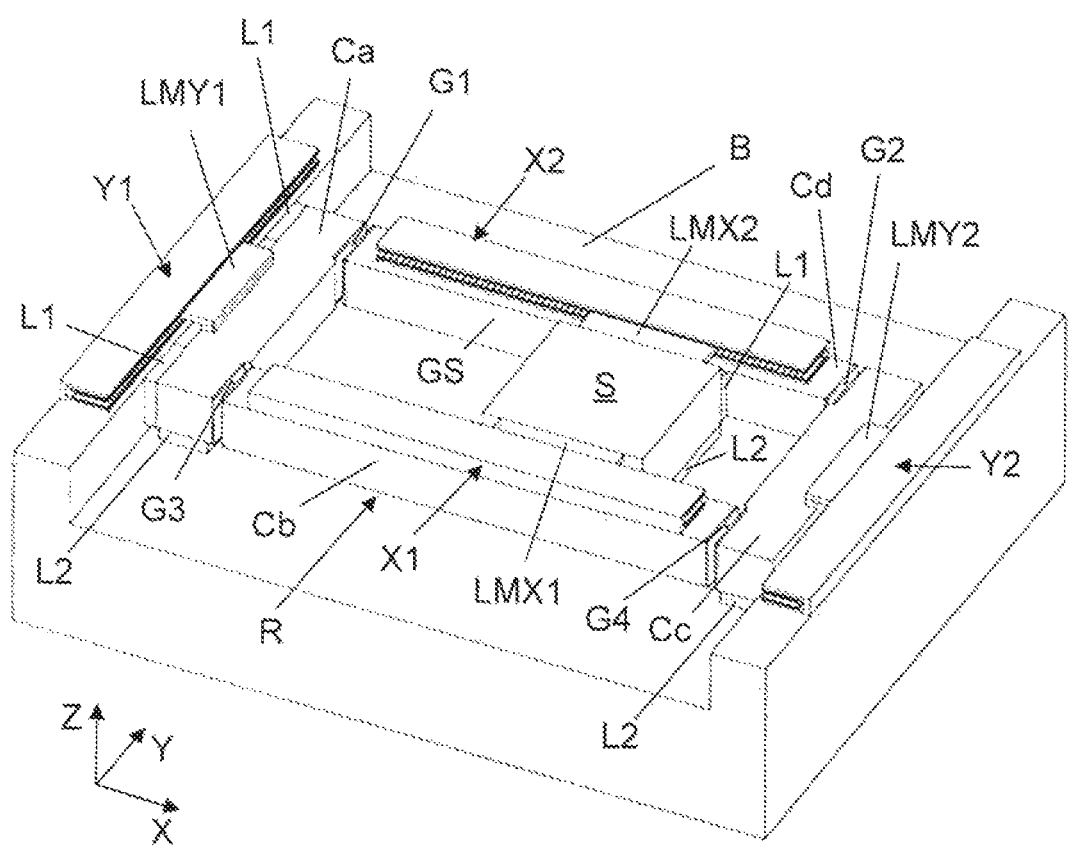
FIG. 1 shows a 3D representation of the positioning device.

In an embodiment, the invention provides a positioning device of a gantry-type design, by means of which highly precise positioning of a movable element in three degrees of freedom within a plane is possible, said device being constructed more simply and cost-effectively than in the prior art.

An embodiment of the invention provides a gantry-type positioning device having a planar base parallel to a first direction and to a second direction, with two first linear axes disposed in the first direction, each having a first linear drive, wherein the first linear axes movably hold a frame in the first direction. The frame comprises two transverse beams which run in the second direction and are fastened to two longitudinal beams running in the first direction and which, together with the transverse beams, form the frame, wherein in each case, one of the longitudinal beams is connected to one of the first linear drives. The transverse beams carry second linear axes, each having a second linear drive parallel to the second direction, so that a movable element, which is arranged between the transverse beams, is held movably with the second linear drives in the second direction. The frame is designed to be flexible in such a way that, in addition to translation in the first and second directions, the movable element can also be rotated about a third direction which is perpendicular to the first and second directions. With respect to the third direction and the rotations about the first and second directions, the movable element is guided by the planar base, and with respect to the first direction, is guided by a guide surface of precisely one of the transverse beams, which thus serves as a guide beam for the movable element.

According to an embodiment of the invention, it is sufficient for only one guide beam of the frame to be made of a high-quality material and to have a precisely machined surface, while the three other beams of the frame can be manufactured from an inexpensive material such as aluminum. As a result, the frame can on the one hand be designed lighter, which yields advantages in the dynamics of the positioning device. On the other hand, the material costs and, as a result of easier machining of the less high-quality materials, also the machining costs and thus the total production costs for such a frame are lower than in the prior art.

If the longitudinal and transverse beams are connected to one another in a suitable manner at the corners of the frame, the positioning of the movable element is also made possible within certain limits with respect to rotation about the third direction perpendicular to the planar base. For this purpose, it is advantageous if joints in the corners of the frame permit a total of four degrees of freedom which lie in the plane of the base. These degrees of freedom, also referred to herein as in-plane degrees of freedom, are translations in the first and second directions parallel to the plane of the base and rotations about the third direction perpendicular to the base. In the simplest case, this can be achieved by a flexure joint in each of the four corners of the frame, wherein the flexure joints each permit rotation about the third direction. Thus, the frame can then have angles at its corners other than 90 degree angles. The transverse beams will then no longer be perpendicular to the longitudinal beams, but will still be parallel to one another.

In a preferred embodiment, the positioning device has, between a preloaded air bearing, with which the movable element is guided on the guide beam, and the movable element itself, a joint with a virtual pivot point which is located in the center of gravity of the movable element. In this way, no torque is generated about the third direction when the movable element is accelerated in the second direction.

Further advantages and details of the present invention will, by reference to the figures, become apparent from the following description of various exemplary embodiments.

FIG. 1 shows a 3D view of the positioning device in accordance with a first exemplary embodiment. A planar base B carries two parallel linear axes Y1, Y2 with first linear drives LMY1, LMY2 parallel to a first direction Y lying in the plane of the base B. A linear axis is understood here to mean a combination of linear guide, linear motor and position measuring device, such as are customary in positioning devices. With a corresponding control device, such axes can be positioned in a known manner.

The movable rotors of the linear drives LMY1, LMY2 are each connected to a longitudinal beam Ca, Cc of a frame R. The longitudinal beams Ca, Cc lie parallel to the first direction Y. The frame R is as a whole movably guided in the first direction Y and can be positioned by the first linear drives LMY1, LMY2.

The frame R also has two transverse beams Cb, Cd which run basically in a second direction X perpendicular to the first direction Y. In the corners of the frame R, the longitudinal and transverse beams Ca, Cc, Cb, Cd in this first exemplary embodiment are connected to four joints G1, G2, G3, G4 which are designed as flexure joints and each permit a rotational degree of freedom about a third direction Z perpendicular to the planar base B, while all other degrees of freedom are blocked by the joints G1, G2, G3, G4. The frame R can thereby be skewed within certain limits in such a way that the transverse beams Cb, Cd deviate somewhat from the second direction X. In this exemplary embodiment, the joints G1, G2, G3, G4 thus permit a total of four in-plane degrees of freedom.

In addition, the transverse beams Cb, Cd each have a second linear axis X1, X2 that having second linear drives LMX1, LMX2. The movable rotors of these second linear drives LMX1, LMX2 are connected to a movable element S, the positioning of which is the real task of the positioning device. The movable element S can carry, for example, a stage for depositing a wafer, which can then be positioned under a microscope by means of the positioning device. This enables various locations on the wafer to be inspected. Thanks to the joints G1, G2, G3, G4, a corresponding counter-rotating rotation of the movable element S can be effected in order to correct a slight skewing of the wafer, which can hardly be avoided when the wafer is deposited, by driving the second linear drives LMX1, LMX2 in opposite directions. Then, as is usually desired, the structures of the wafer lie aligned under the microscope exactly parallel to the first and second directions Y, X.

Figure 2:
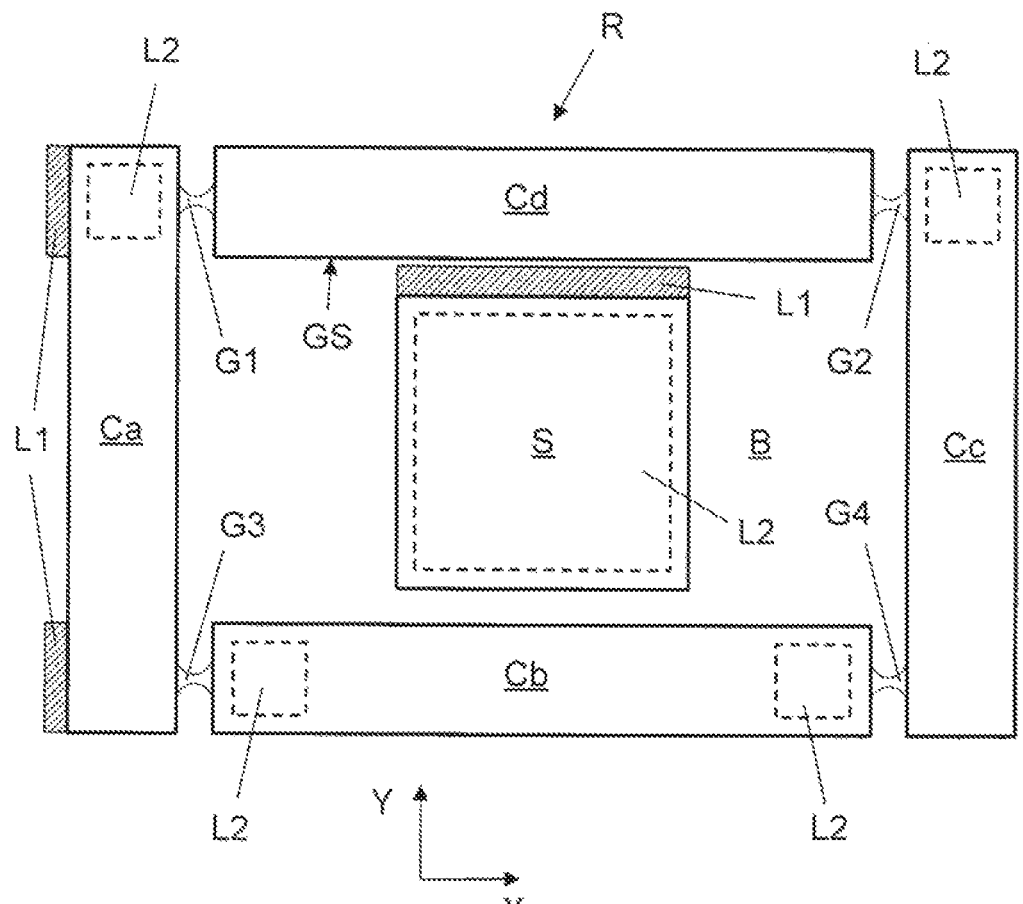
FIG. 2 shows a plan view of the frame of the positioning device.

In order to keep friction to a minimum, the movable parts of the positioning device are equipped with air bearings L1, L2, whose arrangement can be better seen in FIG. 2. In this FIG. 2 as well as in the following FIG. 3, the linear drives LMY1, LMY2, LMX1, LMX2 are not shown for greater clarity, reference being made here to FIG. 1.

The longitudinal beam Ca and thus the entire frame R are guided by means of two lateral air bearings L1 on a vertical projection of the base B running in the first direction Y. Preloaded air bearings are used here, so that the opposite transverse beam Cc of the frame R does not have to be guided separately with lateral air bearings. However, such opposing lateral air bearings on the transverse beam Cc would be a conceivable modification of the embodiment shown. The opposing air bearings would then preload each other.

In relation to the planar base B, the frame R is supported with four horizontal air bearings L2, whose arrangement can be clearly seen in FIG. 2 and whose preferred arrangement will be explained in more detail below. These can be conventional air bearings which are preloaded by the weight of the frame R. However, since its mass is relatively low, air bearings preloaded by means of a vacuum are also preferred here in order to achieve a sufficiently high rigidity of the horizontal air bearings L2. The same also applies to the horizontal air bearing L2 of the movable element S.

With a preloaded lateral air bearing L1, the movable element S is also guided on a guide surface GS of the transverse beam Cd, said guide surface facing the interior of the frame R. This transverse beam Cd is therefore also referred to as the guide beam Cd. This lateral air bearing L1 between the movable element S and the guide beam Cd or the guide surface GS ensures that the movable element S follows all movements of the frame R in the first direction Y. In other words, with respect to the first direction Y, the movable element S is guided by the guide surface GS of the guide beam Cd.

It is particularly advantageous that, in the frame R, only the guide beam Cd needs to be manufactured from a particularly high-quality material (for example one having a low coefficient of thermal expansion or a particularly high strength) and be machined particularly accurately as regards its guide surface GS. On the other hand, the other beams Ca, Cb, Cc of the frame R can consist of less high-quality materials and do not need to be machined as accurately. For example, silicon carbide SiC or aluminum oxide $Al_2O_3$ can be used as the material for the guide beam Cd, while the other beams can be made of aluminum. All beams Ca, Cb, Cc, Cd of the frame R are preferably designed as hollow profiles.

Figure 3:
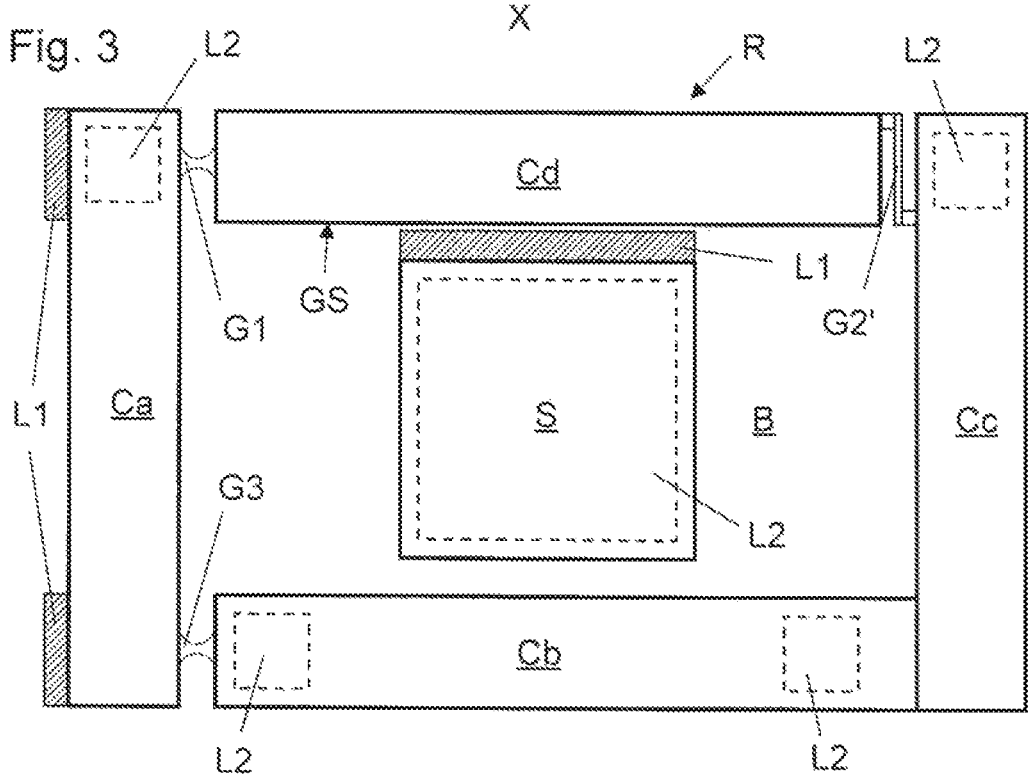
FIG. 3 shows a plan view of a frame according to another exemplary embodiment.

FIG. 3 shows another exemplary embodiment of the invention in which the configuration of the corners of the frame R is changed. The corner situated at bottom right in FIG. 3 is now designed as a rigid connection without any joint. In order nevertheless to obtain four in-plane degrees of freedom, the joint G2' shown at top right is therefore a flexure joint which, in addition to the rotational degree of freedom about the third direction Z, permits a translational degree of freedom in the second direction x, while all other degrees of freedom are blocked. Together with the two rotational degrees of freedom of the flexure joints G1 and G3, four in-plane degrees of freedom are therefore again present in the frame R. This frame too can deform within certain limits in such a way that the movable element S can be rotated about the third direction Z. Other combinations of joints are possible if they also permit a total of four in-plane degrees of freedom.

Regarding the arrangement of the horizontal air bearings L2, as can be clearly seen in FIGS. 2 and 3, the following is also noted: The frame R is supported by the horizontal air bearings L2 against the force of gravity. The beams Ca, Cb, Cc, Cd lying between the horizontal air bearings L2 represent oscillatory components. Care should be taken when placing the horizontal air bearings L2 that the resonance frequencies of the beams between the air bearings are approximately equal. The consequence of this for the frame R according to the invention is that the frame R is guided on the planar base B by means of four horizontal air bearings L2, of which two horizontal air bearings L2 lie below the longitudinal beams Ca, Cc, namely at their ends close to the guide beam Cd, and the other two horizontal air bearings L2 lie below the transverse beam Cb lying parallel to the guide beam Cd, namely in each case at the two ends of this transverse beam Cb. The distances between the horizontal air bearings L2 bridged by the transverse beams Ca, Cb, Cc are thus approximately the same, while the distance between the horizontal air bearings L2 bridged by the guide beam Cd is somewhat larger. Thanks to better material properties, the guide bar Cd, despite its longer span, has approximately the same resonant frequencies as the shorter sections between the horizontal air bearings L2 made of aluminum.

Alternatively, it can also be provided for the frame R to be guided on the planar base B by means of five horizontal air bearings L2, in larger machines for example, of which two horizontal air bearings L2 in each case lie below the longitudinal beams Ca, Cc, namely at their ends close to the transverse beams Cb, Cd, and a further horizontal air bearing L2 lies below the transverse beam Cb lying parallel to the guide beam Cd, namely at the center of this transverse beam Cb. This arrangement too leads to approximately equal distances of the regions bridged by the aluminum between the horizontal air bearings L2, and to a greater distance along the guide beam Cd made of the high-quality material. For smaller machines, just three horizontal air bearings below the frame R can also suffice. For this purpose, the two air bearings L2 arranged at the ends of the beam Cb in FIG. 2 can be replaced by a single one at the center of the beam Cb.

Figure 4:
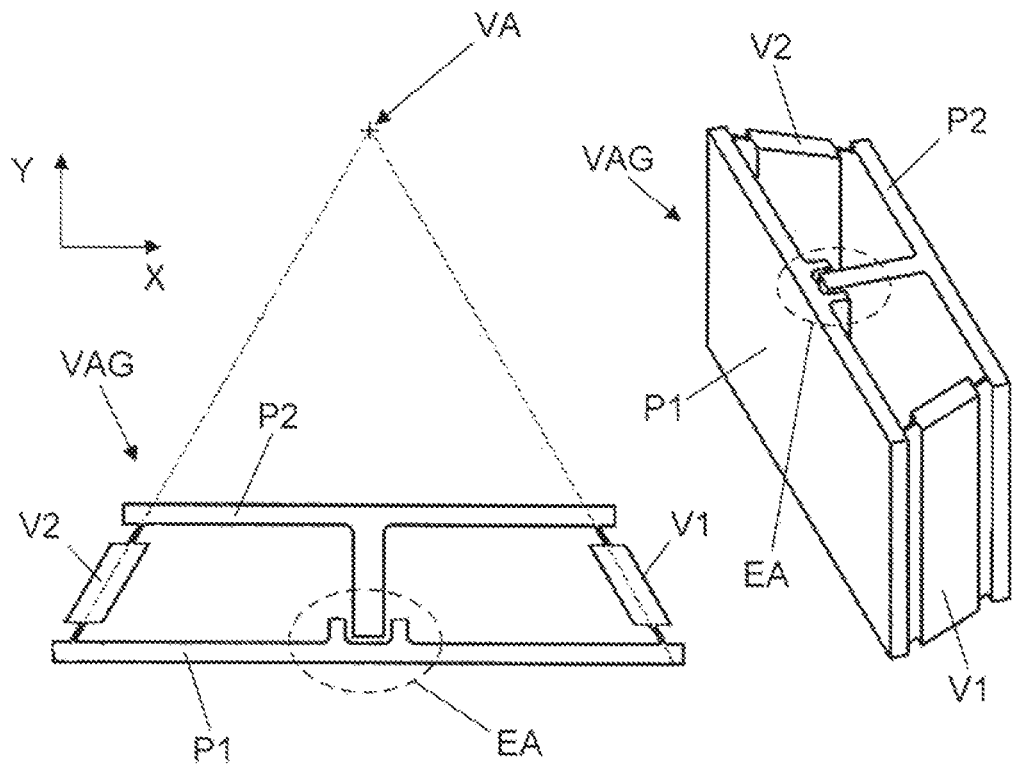
FIG. 4 shows a joint with a virtual pivot point.
Figure 5:
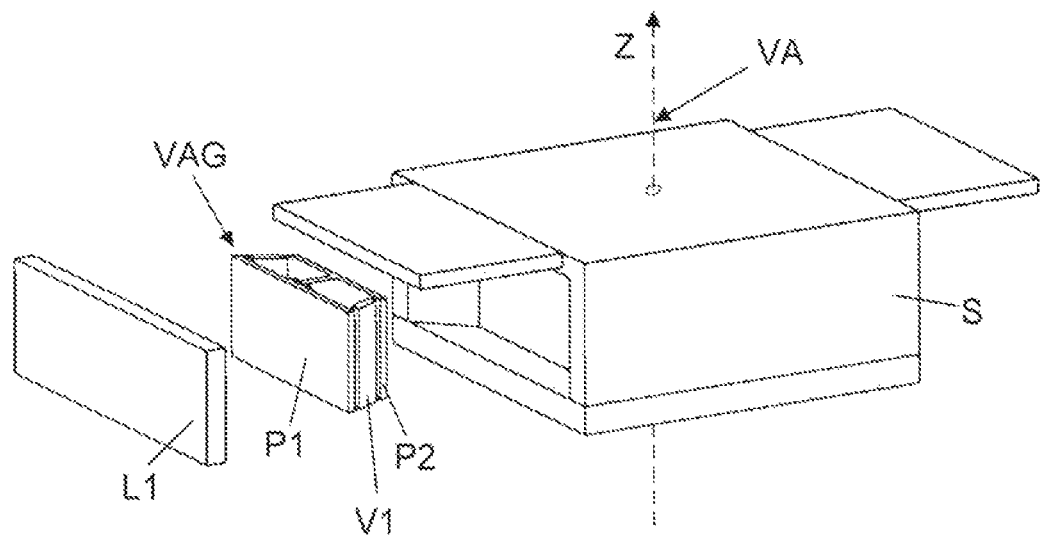
FIG. 5 shows the positioning of the joint in FIG. 4 between an air bearing and the movable element.

The fact that the movable element S is guided on its guide surface GS with respect to the first direction Y only on the side facing the guide bar Cd leads to a certain asymmetry of the arrangement. In the case of an acceleration of the movable element S in the second direction X, undesired torques can arise due to the heavy lateral air bearing L1 arranged only on one side of the movable element S. In order to prevent this, a joint VAG with a virtual axis of rotation VA as shown in FIG. 4 is used which, as shown in FIG. 5, is inserted between the movable element S and the lateral air bearing L1 sliding over the guide surface GS. The virtual axis of rotation VA in this case runs through the center of mass of the movable element S and perpendicular to the planar base B. Upon acceleration of the movable element S with lateral air bearing L1 in the second direction X, the lateral air bearing L1 generates a torque and a force proportional to the acceleration. The torque is transmitted to the guide beam Cd, the force acting on the movable element VA at the virtual rotation axis VA. Since the center of mass of the movable element S and the virtual rotation axis VA lie exactly in the center of the second linear drives LMX1, LMX2, the second linear drives LMX1, LMX2 can accelerate perfectly balanced with the same force.

The same also applies to rotational acceleration about the central axis of rotation, wherein the motors can accelerate with the same opposing force, thus resulting in optimal utilization.

The joint VAG with the virtual axis of rotation VA is composed of two parallel plates P1, P2 which are held at a distance by two mutually inclined connecting bars V1, V2. The connecting bars V1, V2 have weak points and act as flexure joints so that one plate P2 can be inclined with respect to the other plate P1. The virtual axis of rotation VA of this inclination movement is external to the joint VAG in this case.

The joint VAG with the virtual axis of rotation VA also has a mechanical end stop EA which is intended to prevent excessive deflection and thus damage to the joint VAG. In the example, this is achieved by a projection on the one plate P2 which projects into an opposite seat or recess on the other plate P1, but without contacting it. At maximum deflection, the projection on the plate P2 contacts the opposite recess in plate P1. The clearance between projection and recess determines the maximum possible deflection of the joint VAG.

By means of the joint VAG with the virtual axis of rotation VA, the rotation of the movable element S about the third direction Z is decoupled from the guide beam Cd. This rotation is therefore set solely by the two second linear drives LMX1, LMX2.

Preferably, the structure in question is mounted on the movable element S (i.e., for example, a stage or chuck for depositing a wafer) in such a way that its center coincides with the center of the movable element S. This common axis of rotation then corresponds to the smallest moment of inertia and thus enables the greatest dynamics. In addition, due to the central virtual axis of rotation, no additional corrections in X or Y are required, so that the frame R does not need to be accelerated for this purpose. This enables the movable element S to be driven in an energy-efficient manner.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A positioning device of a gantry-type design, the positioning device comprising:
   a planar base parallel to a first direction and to a second direction;
   two first linear axes arranged in the first direction, each of the first linear axes having a first linear drive;
   a frame held by the first linear axes, the frame being movable in the first direction, the frame comprising two transverse beams running in the second direction and two longitudinal beams running in the first direction that are attached to the transverse beams, wherein one of the longitudinal beams is in each case connected to one of the first linear drives, and wherein the transverse beams carry second linear axes in each case with a second linear drive parallel to the second direction, so that a movable element arranged between the transverse beams is movably held by the second linear drives in the second direction, whereby the movable element is movable in the first and second directions, and wherein the frame is flexibly constructed such that the movable element is rotatable about a third direction which is perpendicular to the first and second directions,
   wherein the movable element is guidable by the planar base with respect to the third direction and rotations about the first and second directions,
   wherein, with respect to the third direction, the movable element is guidable by a guide surface of only one of the transverse beams which thereby serves as a guide beam for the movable element, and
   wherein the guide beam is connected via joints to the longitudinal beams, each of the joints allowing for rotation about the third direction.

2. The positioning device according to claim 1, wherein one of the joints on the guide beam additionally allows for translation in the first direction.

3. The positioning device according to claim 2, wherein one of the transverse beams and one of the longitudinal beams are rigidly connected to each other in one corner of the frame.

4. The positioning device according to claim 1, wherein the joints between the longitudinal beams and the transverse beams of the frame connect the transverse beams and the longitudinal beams to one another such that a total of four in-plane degrees of freedom impart flexibility to the frame.

5. The positioning device according to claim 1, wherein the joints are flexure joints.

6. The positioning device according to claim 1, wherein the guide beam is made of a material which differs from a material of the longitudinal beams and a second one of the transverse beams which does not serve as the guide beam.

7. The positioning device according to claim 6, wherein the guide beam is made of silicon carbide or aluminum oxide.

8. The positioning device according to claim 6, wherein the longitudinal beams and the second transverse beam are made of aluminum.

9. The positioning device according to claim 6, wherein the guide beam has a hollow profile.

10. The positioning device according to claim 6, wherein the frame is guidable on the planar base by four horizontal air bearings, of which two of the horizontal air bearings lie below the longitudinal beams at ends near the guide beam, and another two of the horizontal air bearings lie below the second transverse beam parallel to the guide beam at ends of the second transverse beam.

11. The positioning device according to claim 6, wherein the frame is guidable on the planar base by five horizontal air bearings, of which two of the horizontal air bearings lie below the longitudinal beams at ends close to the transverse beams, and wherein a further one of the horizontal air bearings lies below the second transverse beam lying parallel to the guide beam in a center of the second transverse beam.

12. The positioning device according to claim 1, wherein the movable element is guidable on the guide surface of the guide beam by a preloaded lateral air bearing.

13. The positioning device according to claim 1, wherein a joint is arranged between the guide surface of the guide beam and the movable element and has a virtual axis of rotation for rotating the movable element about the third direction.

14. The positioning device according to claim 13, wherein the virtual rotation axis passes through a center of mass of the movable element.

15. The positioning device according to claim 13, wherein the rotation of the movable element about the third direction which is perpendicular to the first and second directions is adjustable by the second linear drives.

16. A positioning device of a gantry-type design, the positioning device comprising:
   a planar base parallel to a first direction and to a second direction;
   two first linear axes arranged in the first direction, each of the first linear axes having a first linear drive;
   a frame held by the first linear axes, the frame being movable in the first direction, the frame comprising two transverse beams running in the second direction and two longitudinal beams running in the first direction that are attached to the transverse beams, wherein one of the longitudinal beams is in each case connected to one of the first linear drives, and wherein the transverse beams carry second linear axes in each case with a second linear drive parallel to the second direction, so that a movable element arranged between the transverse beams is movably held by the second linear drives in the second direction, whereby the movable element is movable in the first and second directions, and wherein the frame is flexibly constructed such that the movable element is rotatable about a third direction which is perpendicular to the first and second directions, wherein the movable element is guidable by the planar base with respect to the third direction and rotations about the first and second directions, wherein, with respect to the third direction, the movable element is guidable by a guide surface of only one of the transverse beams which thereby serves as a guide beam for the movable element, and wherein the guide beam is made of a material which differs from a material of the longitudinal beams and a second one of the transverse beams which does not serve as the guide beam.

17. The positioning device according to claim 16, wherein the guide beam is made of silicon carbide or aluminum oxide.

18. The positioning device according to claim 16, wherein the longitudinal beams and the second transverse beam are made of aluminum.

19. The positioning device according to claim 16, wherein the guide beam has a hollow profile.

20. A positioning device of a gantry-type design, the positioning device comprising:

a planar base parallel to a first direction and to a second direction;

two first linear axes arranged in the first direction, each of the first linear axes having a first linear drive;

a frame held by the first linear axes, the frame being movable in the first direction, the frame comprising two transverse beams running in the second direction and two longitudinal beams running in the first direction that are attached to the transverse beams, wherein one of the longitudinal beams is in each case connected to one of the first linear drives, and wherein the transverse beams carry second linear axes in each case with a second linear drive parallel to the second direction, so that a movable element arranged between the transverse beams is movably held by the second linear drives in the second direction, whereby the movable element is movable in the first and second directions, and wherein the frame is flexibly constructed such that the movable element is rotatable about a third direction which is perpendicular to the first and second directions, wherein the movable element is guidable by the planar base with respect to the third direction and rotations about the first and second directions, wherein, with respect to the third direction, the movable element is guidable by a guide surface of only one of the transverse beams which thereby serves as a guide beam for the movable element, and wherein the movable element is guidable on the guide surface of the guide beam by a preloaded lateral air bearing.

* * * * *